United States Patent
Kim et al.

(10) Patent No.: US 12,465,940 B2
(45) Date of Patent: Nov. 11, 2025

(54) SUBSTRATE PROCESSING APPARATUS

(71) Applicant: WONIK IPS CO., LTD., Pyeongtaek-si (KR)

(72) Inventors: Da Been Kim, Pyeongtaek-si (KR); Jun Hyeong Lee, Pyeongtaek-si (KR); Tae Ho Ham, Pyeongtaek-si (KR); Cheol Woo Lee, Pyeongtaek-si (KR); Kwang Ha Choi, Pyeongtaek-si (KR)

(73) Assignee: WONIK IPS CO., LTD., Pyeongtaek-si (KR)

( * ) Notice: Subject to any disclaimer, the term of this patent is extended or adjusted under 35 U.S.C. 154(b) by 115 days.

(21) Appl. No.: 18/485,743

(22) Filed: Oct. 12, 2023

(65) Prior Publication Data
US 2024/0375141 A1    Nov. 14, 2024

(30) Foreign Application Priority Data
May 8, 2023  (KR) .......................... 10-2023-0059435

(51) Int. Cl.
*B05B 13/02*    (2006.01)

(52) U.S. Cl.
CPC ................................ *B05B 13/0242* (2013.01)

(58) Field of Classification Search
None
See application file for complete search history.

(56) References Cited

U.S. PATENT DOCUMENTS

| | | | |
|---|---|---|---|
| 5,795,448 A * | 8/1998 | Hurwitt | C23C 14/505 204/192.12 |
| 7,516,833 B2 * | 4/2009 | Todaka | H01L 21/68721 414/744.1 |
| 8,034,723 B2 | 10/2011 | Ohizumi et al. | |
| 9,732,424 B2 * | 8/2017 | Lee | H01L 21/68771 |
| 10,109,517 B1 * | 10/2018 | Blank | H01L 21/67742 |
| 12,020,969 B2 | 6/2024 | Tamatsukuri et al. | |
| 12,217,985 B2 * | 2/2025 | Topping | H01L 21/67196 |

(Continued)

FOREIGN PATENT DOCUMENTS

| | | |
|---|---|---|
| CN | 115206863 A | 10/2022 |
| JP | H11156770 A | 6/1999 |
| JP | 2000006080 A | 1/2000 |

(Continued)

*Primary Examiner* — William R Harp
(74) *Attorney, Agent, or Firm* — WILLIAM PARK AND ASSOCIATES LTD.

(57) ABSTRACT

Disclosed herein is a substrate processing apparatus including a process chamber having a processing space defined therein to process a plurality of substrates, a gas injector provided on a upper side of the process chamber to inject a processing gas into the processing space, a plurality of substrate supports arranged inside the process chamber, the substrates being seated on the substrate supports, a substrate conveyor disposed in the process chamber to convey the plurality of substrates to different substrate supports among the substrate supports, and a substrate rotating part arranged to allow each of the plurality of substrates to be seated between neighboring ones of the plurality of substrate supports, and to rotate the substrates, wherein the substrate rotating part may include a tension adjuster disposed on at least a portion of the power transmitter to adjust a tension in the power transmitter.

10 Claims, 6 Drawing Sheets

(56) References Cited

U.S. PATENT DOCUMENTS

2013/0287949 A1 10/2013 Cho et al.
2023/0170247 A1 6/2023 Choi et al.

FOREIGN PATENT DOCUMENTS

| JP | 2000183125 A | 6/2000 |
| JP | 2011151387 A | 8/2011 |
| KR | 1020160095872 A | 8/2016 |
| KR | 1020220081640 A | 6/2022 |
| KR | 1020230080046 A | 6/2023 |
| WO | 2019244982 A1 | 12/2019 |

* cited by examiner

SUBSTRATE PROCESSING APPARATUS

CROSS-REFERENCE TO RELATED APPLICATION

This application claims priority under 35 U.S.C. § 119 (a) to and the benefit of Korean Patent Application No. 10-2023-0059435, filed on May 8, 2023, in the Korean Intellectual Property Office, the disclosure of which is incorporated herein by reference in its entirety.

BACKGROUND

1. Field of the Invention

The present disclosure relates to a substrate processing apparatus, and more particularly, to a substrate processing apparatus for performing substrate processing on a plurality of substrates in a process chamber.

2. Description of the Related Art

In a conventional substrate processing apparatus, substrate processing of a plurality of substrates is sometimes performed in a single process chamber for various purposes such as productivity and process uniformity.

To this end, a conventional substrate processing apparatus may include a process chamber defining a plurality of processing spaces and allowing substrate processing to be performed therein, a plurality of gas injectors installed on the upper side of the process chamber to inject process gas into the processing spaces, and a plurality of substrate supports installed in the process chamber and corresponding to the plurality of gas injectors to support the substrates.

In this case, a plurality of substrates introduced into the process chamber is disposed in the respective processing space by a substrate conveyor and substrate processing is performed thereon. Then, when the substrate processing is completed, the substrates that have been processed are discharged from the process chamber.

Meanwhile, a module for rotating a substrate around a vertical rotary shaft is being developed to make the film thickness uniform during the substrate processing, and a component to connect a plurality of rotary modules to rotate a plurality of substrates simultaneously is being developed.

However, tension of a connection device such as a belt connecting a plurality of rotary modules may not be maintained due to changes in temperature inside the chamber, causing the positions of the rotary modules to change.

SUMMARY OF THE DISCLOSURE

The present disclosure aims to solve the above-mentioned problems, and to provide a substrate processing apparatus capable of preventing tension of a connection structure, such as a belt connecting a plurality of rotary modules, from changing due to a change in temperature inside a chamber, and compensating for the changed tension. However, this object is exemplary and is not intended to limit the scope of the present disclosure.

In accordance with the present disclosure, the above and other objects can be accomplished by the provision of a substrate processing apparatus including a process chamber having a processing space defined therein to process a plurality of substrates, a gas injector provided on a upper side of the process chamber to inject a processing gas into the processing space, a plurality of substrate supports arranged inside the process chamber to face the gas injector, the plurality of substrates being seated on the plurality of substrate supports, a substrate conveyor disposed in the process chamber to convey the plurality of substrates seated on the substrate supports to different substrate supports among the substrate supports, and a substrate rotating part arranged to allow each of the plurality of substrates to be seated between neighboring substrate supports among the plurality of substrate supports, and to rotate the plurality of seated substrates, wherein the substrate rotating part may include a drive shaft disposed at a lower portion of the process chamber to be rotationally driven about a center axis, a rotating plate connected to the drive shaft to rotate with rotation of the drive shaft, the rotating plate comprising a plurality of rotating seats allowing the plurality of substrates to be seated thereon, a power transmitter connecting the drive shaft and the rotating plate to allow a rotational force of the drive shaft to be transmitted to the rotating plate, and a tension adjuster disposed on at least a portion of the power transmitter to adjust a tension in the power transmitter connecting the drive shaft and the rotating plate.

According to some embodiments of the present disclosure, the tension adjuster may include a pivotal shaft formed in a cylindrical shape, a pivoting part coupled to the pivotal shaft and extending in both directions so that one end and the other end are rotated around the pivotal shaft, an elastic part arranged to press against the one end of the pivoting part, and a first pulley disposed to be at least partially surrounded by the power transmitter, the first pulley being rotatably coupled to the other end of the pivoting part.

According to some embodiments of the present disclosure, the pivoting part may include a center portion penetrated in a circular shape to allow the pivotal shaft to be inserted thereinto, a first extension extending from the center portion to one side direction, and pressed by the elastic part, and a second extension extending from the center portion to the other side direction, a second extension having one end coupled to the first pulley.

According to some embodiments of the present disclosure, the second extension may be inclined at a predetermined angle with respect to any extended line of the first extension.

According to some embodiments of the present disclosure, the pivoting part may include a through-hole formed by penetrating at least one portion of the one end of the pivoting part to allow a fixed portion of the elastic part to be inserted thereinto, wherein the through-hole may be elongated in a longitudinal direction of the pivoting part to allow the pivoting part surrounding the fixed portion to be rotated when the pivotal shaft is rotated about the pivotal part.

According to some embodiments of the present disclosure, the elastic part may include a fixed portion disposed to be inserted into at least a portion of the pivoting part, an elasticity adjuster coupled to a portion of the fixed portion and having a cross-section larger than the fixed portion, and an elastic member disposed between the pivoting part and the elasticity adjuster to push the pivoting part away from the elasticity adjuster. According to some embodiments of the present disclosure, the elasticity adjuster may be screw-coupled to the fixed portion so as to be fixed at any position on the fixed portion.

According to some embodiments of the present disclosure, the elastic part may include an anti-separation portion coupled to a distal end of the fixed portion to prevent the elasticity adjuster from being separated from the fixed portion.

According to some embodiments of the present disclosure, the elastic member may be any one of a coil spring, an elastic block, a pair of magnetic materials, or a combination thereof.

According to some embodiments of the present disclosure, the power transmitter may be a belt formed in a closed shape, the apparatus may include a plurality of second pulleys disposed under the rotating plate and coupled to an inner side of the power transmitter. The drive shaft may be coupled to an outer side of the power transmitter, and the tension adjuster may be coupled to the inner side of the power transmitter to push the power transmitter outward to create a tension in the power transmitter.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
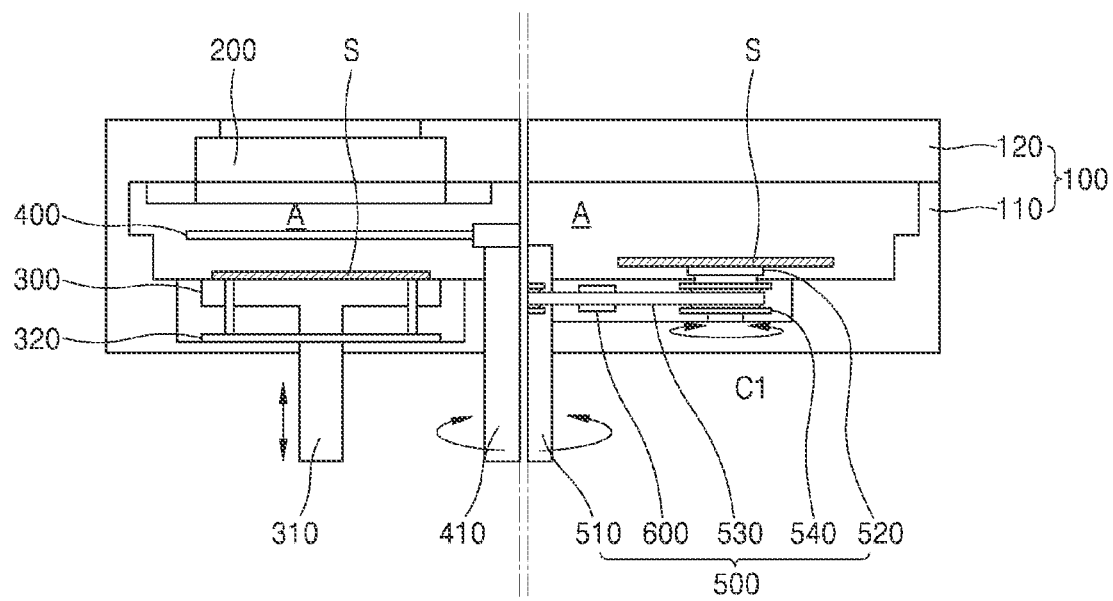
FIG. 1 is a schematic cross-sectional view illustrating a substrate processing apparatus according to one embodiment of the present disclosure.

Hereinafter, several preferred embodiments of the present disclosure will be described in detail with reference to the accompanying drawings.

The embodiments of the present disclosure are provided to provide a thorough understanding of the present disclosure to those skilled in the art. Various modifications may be made to the following embodiments, and the scope of the present disclosure is not limited to the following embodiments. Rather, these embodiments are provided to make the disclosure complete and to fully convey the ideas of the disclosure to those skilled in the art. In addition, the thickness or size of each layer in the drawings is exaggerated for ease of illustration and clarity.

Hereinafter, embodiments of the present disclosure will be described with reference to the drawings, which schematically illustrate idealized embodiments of the present disclosure. In the drawings, variations in the illustrated geometries may be expected, for example, due to manufacturing techniques and/or tolerances. Accordingly, embodiments of the present disclosure should not be construed as limited to the specific geometry of the areas illustrated herein, but should include, for example, variations in geometry resulting from manufacturing.

Figure 2:
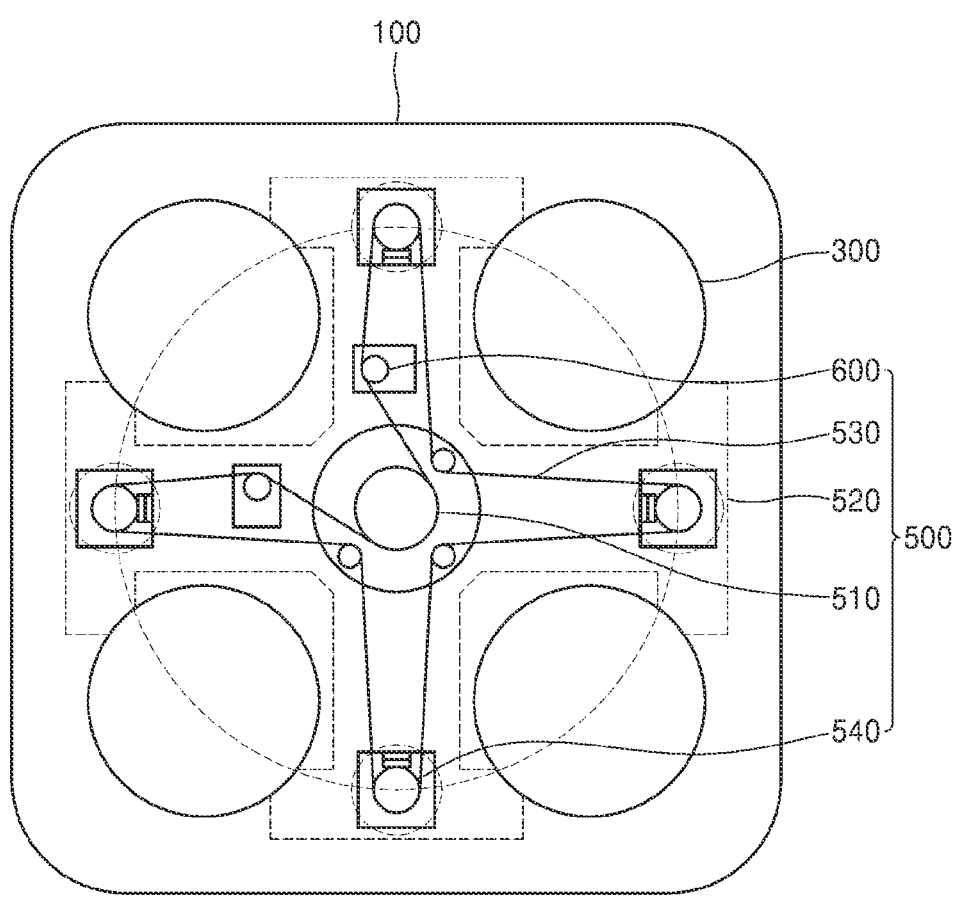
FIG. 2 is a top view illustrating a substrate support and a substrate rotating part in the process chamber of FIG. 1.
Figure 3:
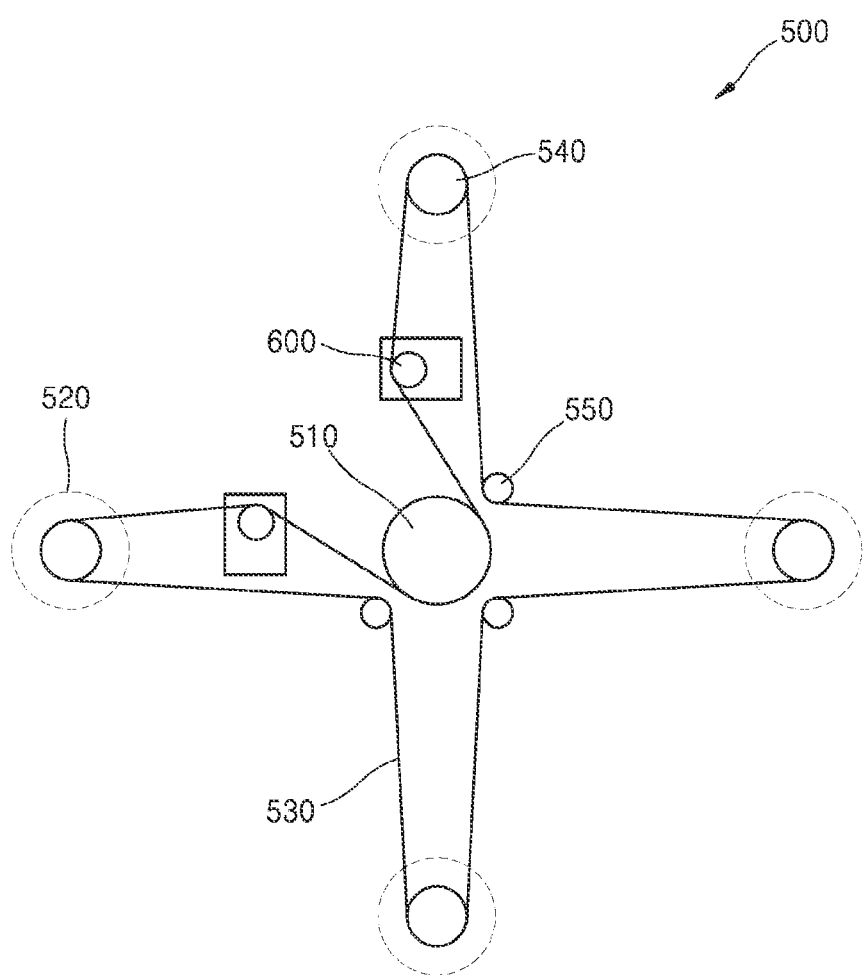
FIG. 3 is a top view illustrating the substrate rotating part of the substrate processing apparatus according to one embodiment of the present disclosure.

FIG. 1 is a schematic cross-sectional view illustrating a substrate processing apparatus according to one embodiment of the present disclosure. FIG. 2 is a top view illustrating a substrate support 300 and a substrate rotating part 500 in the process chamber 100 of FIG. 1. FIG. 3 is a top view illustrating the substrate rotating part 500.

First, the substrate processing apparatus according to one embodiment of the present disclosure may include a process chamber 100, a gas injector 200, a substrate support 300, a substrate conveyor 400, and a substrate rotating part 500.

As shown in FIG. 1, the process chamber 100 may have a processing space A formed therein for processing of a plurality of substrates S.

Specifically, the process chamber 100 may include a chamber body 110 having an opening formed on a top side, and a top lid 120 removably coupled to the opening in the chamber body 110 to define the processing space A together with the chamber body 110.

Further, the process chamber 100 may define a plurality of different processing spaces A for substrate processing of a plurality of substrates. In this case, the processing spaces A may not be fully sealed off from each other within the process chamber 100, but may be spatially separated spaces.

For example, as shown in FIG. 2, the process chamber 100 may define four processing spaces A on top of the substrate supports 300 that are disposed circumferentially in a plane.

In this case, a substrate support seating groove, in which the substrate support 300 is formed, may be formed on a floor surface of the chamber body 110. For example, when four substrate supports 300 are provided in the process chamber 100, the four substrate support seating grooves may be formed for the same.

Since the internal space of the process chamber 100 is generally formed in a vacuum atmosphere, an exhaust groove (not shown) and an exhaust port (not shown) may be formed on the floor surface of the chamber body 110 to discharge process gas such as raw material gas, plasma gas, or cleaning gas present in the processing space A.

The exhaust port may be connected with an exhaust line connected to a pump provided at an external location.

The process chamber 100 may have one or more gates (not shown) formed for entry and exit of a plurality of substrates S.

As shown in FIG. 1, the gas injector 200 may be formed on top of the process chamber 100 so as to correspond to the processing spaces A, respectively, and may inject a processing gas into the processing spaces A.

The gas injectors 200 may be installed to correspond to the number of processing spaces A, that is, they may be installed to correspond to the substrate supports 300. For example, the gas injector 200 may include a gas inlet (not shown) installed in the top lead 120 and formed on one side, one or more diffusion plates (not shown) for diffusing process gas introduced through the gas inlet, and a plurality of injection holes (not shown) for injecting the diffused process gas towards the processing spaces A.

As shown in FIG. 1, the substrate support 300 is formed to face each of the gas injectors 200 in the process chamber 100, and may include a plurality of substrate support to allow a plurality of substrates S to be seated thereon.

The substrate support 300 is installed to correspond to each gas injector 200, and may be installed so as to vertically face the gas injector 200.

The substrate support 300 may be provided with a plurality of substrate seats on which a plurality of substrates S is seated, and the plurality of substrate seats may be equidistantly spaced along a circumference centered on a central portion of the process chamber 100. For example, the substrate support 300 may be provided with four substrate seats on which the plurality of substrates S is seated, in a circumferential direction in a plane.

The substrate support 300 may have a shaft 310 formed on a lower portion of the substrate support 300 to support and raise and lower the substrate support 300. The shaft 310 may be formed on a bottom surface of the chamber body 110, and be connected to and driven up and down by a drive part provided on the outside of the process chamber 100.

Specifically, the shaft 310 may be coupled to the substrate support 300 to support the substrate support 300. It may be coupled to the bottom surface of the substrate support 300 through an opening formed through the bottom wall of the process chamber 100, such that it may be vertically moved by a separate up-and-down drive part outside of the process chamber 100.

The substrate support 300 may include vacuum chucks or electrostatic chucks for adsorbing and holding the plurality of substrates S seated on the plurality of substrate seats.

The substrate support 300 may include a heater (not shown) for heating the plurality of substrates S supported on the plurality of substrate seats.

The substrate support 300 may include a lifter 320 arranged under the substrate support 300 to lift the plurality of substrates S off of the plurality of substrate seats.

In loading, unloading, or conveying the plurality of substrates S within the process chamber 100, the lifter 320 may support the plurality of substrates S while the plurality of substrates S is vertically spaced apart from the plurality of substrate seats.

The lifter 320 may include a plurality of lift pins supporting the bottom surface of the plurality of substrates S by vertically extending through the substrate support 300, a lift pin body coupled to the plurality of lift pins and positioned below the substrate support 300.

As shown in FIG. 1, the substrate conveyor 400 may be installed in the process chamber 100 and may convey a plurality of substrates S each seated on the substrate supports 300 to different substrate supports of the substrate supports 300.

Specifically, the substrate conveyor 400 may convey each of the plurality of substrates S from one substrate support of the substrate supports 300 to another substrate support of the substrate supports 300.

In addition, the substrate conveyor 400 may convey a plurality of substrates S from one substrate support 300 to a substrate rotating part 500, which will be described later, or may convey the plurality of substrates S from the substrate rotating part 500 to another substrate support 300.

For example, the substrate conveyor 400 may include at least one or more wings capable of supporting substrates.

The wings may be provided as many as the plurality of substrates S, and may extend radially about the substrate conveyance shaft 410 that rotates at the center of the process chamber 100.

For example, when four substrate supports 300 are formed to process four substrates, four wings may be formed extending conformally from the substrate conveyance shaft 410.

As shown in FIG. 1, the substrate rotating part 500 may be formed such that a plurality of substrates S may each be seated between neighboring substrate supports 300 among the plurality of substrate supports 300, and may rotate the plurality of seated substrates S.

The substrate rotating part 500 may rotate the plurality of substrates S about a vertical axis. Specifically, the substrate rotating part 500 may include a rotating plate 520 allowing the plurality of substrates S seated thereon and configured to rotate around the drive shaft 510, a power transmitter 530 configured to transmit rotational power to the rotating plate 520, and a tension adjuster 600.

As a space for installing the rotation drive part is provided under the process chamber 100, the drive shaft 510, the rotation plate 520, and the power transmitter 530 of the substrate rotating part 500 may be installed in the space for installing the rotation drive part.

As shown in FIGS. 2 and 3, the drive shaft 510 may be formed in a lower portion of the process chamber 100 so as to be rotationally driven about a center axis.

The drive shaft 510 may be arranged coaxially with the substrate conveyance shaft 410, which is the central axis of the substrate conveyor 400. The drive shaft 510 may be provided integrally with or separately from the substrate conveyance shaft 410. For example, the drive shaft 510 may be formed in a partial region of the substrate conveyance shaft 410.

The drive shaft 510 may be operable to rotate independently of the rotation of the substrate conveyance shaft 410.

The drive shaft 510 may be rotated by a power source provided at a lower portion thereof.

The power transmitter 530 may be wound around at least a portion of the perimeter of the drive shaft 510, and rotation of the drive shaft 510 may rotate the power transmitter 530 in either direction, causing the at least one rotating plate 520 connected to the power transmitter 530 to rotate in the same or opposite direction.

As shown in FIGS. 2 and 3, the rotating plate 520 is connected to the drive shaft 510 to rotate with rotation of the drive shaft 510, and may include a plurality of rotating seats allowing a plurality of substrates S to be seated thereon.

The rotating plate 520 may rotate the plurality of substrates S about a first rotation axis C1, which is a vertically oriented rotation axis. Specifically, the rotating plate 520 may rotate about the first rotation axis C1 vertically extending through the center thereof, thereby rotating a substrate seated on the top surface thereof about the first rotation axis C1.

The rotating plate 520 is coupled to an upper side of a second pulley 540 arranged to be rotatable about the first rotation axis C1, and may be rotated in response to rotation of the second pulley 540.

The rotating plate 520 may be configured as an electrostatic or vacuum chuck that adsorbs the plurality of substrates S such that the plurality of substrates S seated on the top of the rotating plate 520 can rotate smoothly without slipping on the top of the rotating plate 520, or may be formed of a material that increases friction against the plurality of substrates S to support the substrates seated thereon.

The rotating plate 520 may be installed in at least one space between the plurality of substrate supports 300. For example, four rotating plates may each be disposed in each of spaces between the substrate supports 300 to simultaneously rotate four substrates supported on four substrate supports 300.

Accordingly, the rotating plates 520 may be disposed in the spaces between the four substrate supports 300, and the power transmitter 530, which will be described later, may be disposed to connect the planar center of the process chamber 100 to the plurality of rotating plates 520 to provide rotational power to each of the rotating plates 520.

The substrate rotating part 500 of the substrate processing apparatus according to some embodiments of the present disclosure may include a power transmission guide 550.

As shown in FIG. 3, the power transmission guide 550 is a pulley structure for guiding the rotational direction and position of the power transmitter to transmit rotational power from the drive shaft 510 to the rotating plate 520.

Specifically, a plurality of power transmission guides 550 may be provided. The power transmitter 530 may be wound around the power transmission guides 550 as well as the drive shaft 510 and the second pulley 540, thereby switching the installation direction of the power transmitter 530.

As shown in FIGS. 2 and 3, the power transmitter 530 may connect the drive shaft 510 and the rotating plate 520 such that a rotational force of the drive shaft 510 may be transmitted to the rotating plate 520.

Specifically, the power transmitter 530 may be wound around the drive shaft 510 and the second pulley 540 to transmit rotational power of the drive shaft 510 to the second pulley 540. For example, the power transmitter 530 may be wound on at least a portion of an outer circumferential surface of a plurality of second pulleys 540 arranged around the drive shaft 510, as shown in FIG. 3. Thus, the plurality of second pulleys 540 may be rotated using a single power transmitter 530.

The power transmitter 530 may be a belt, chain, or the like formed in a closed structure. In this case, the second pulleys 540 arranged under the plurality of rotating plates 520 may be coupled to the inner side of the closed structure of the power transmitter 530, and the power transmission guides 550 arranged between the rotating plates 520 may be coupled to the outer side of the closed structure.

Further, the drive shaft 510 may be coupled to the outer side of the closed structure of the power transmitter 530, and the tension adjuster 600 may be coupled to the inner side of the power transmitter 530.

For example, as shown in FIG. 3, the drive shaft 510 may be coupled to the outer side of the closed structure of the power transmitter 530 and the second pulley 540 under the radially arranged rotating plate 520 may be coupled to and surrounded by the inner side of the closed structure of the power transmitter 530, and may be positioned by the power transmission guide 550 such that it may be installed without being interfered with by the substrate support 300.

As shown in FIGS. 2 and 3, the tension adjuster 600 may be arranged on at least a portion of the power transmitter 530 to adjust the tension of the power transmitter 530, which connects the drive shaft 510 to the rotating plate 520.

Specifically, the tension adjuster 600 may be installed to contact a portion of the power transmitter 530 and may push the power transmitter 530 in one direction to control the tension formed in the power transmitter 530. For example, the tension adjuster 600 may be coupled to the inner side of the closed structure of the power transmitter 530, and may push the power transmitter 530 in an outward direction to form a tension in the power transmitter 530.

Figure 4:
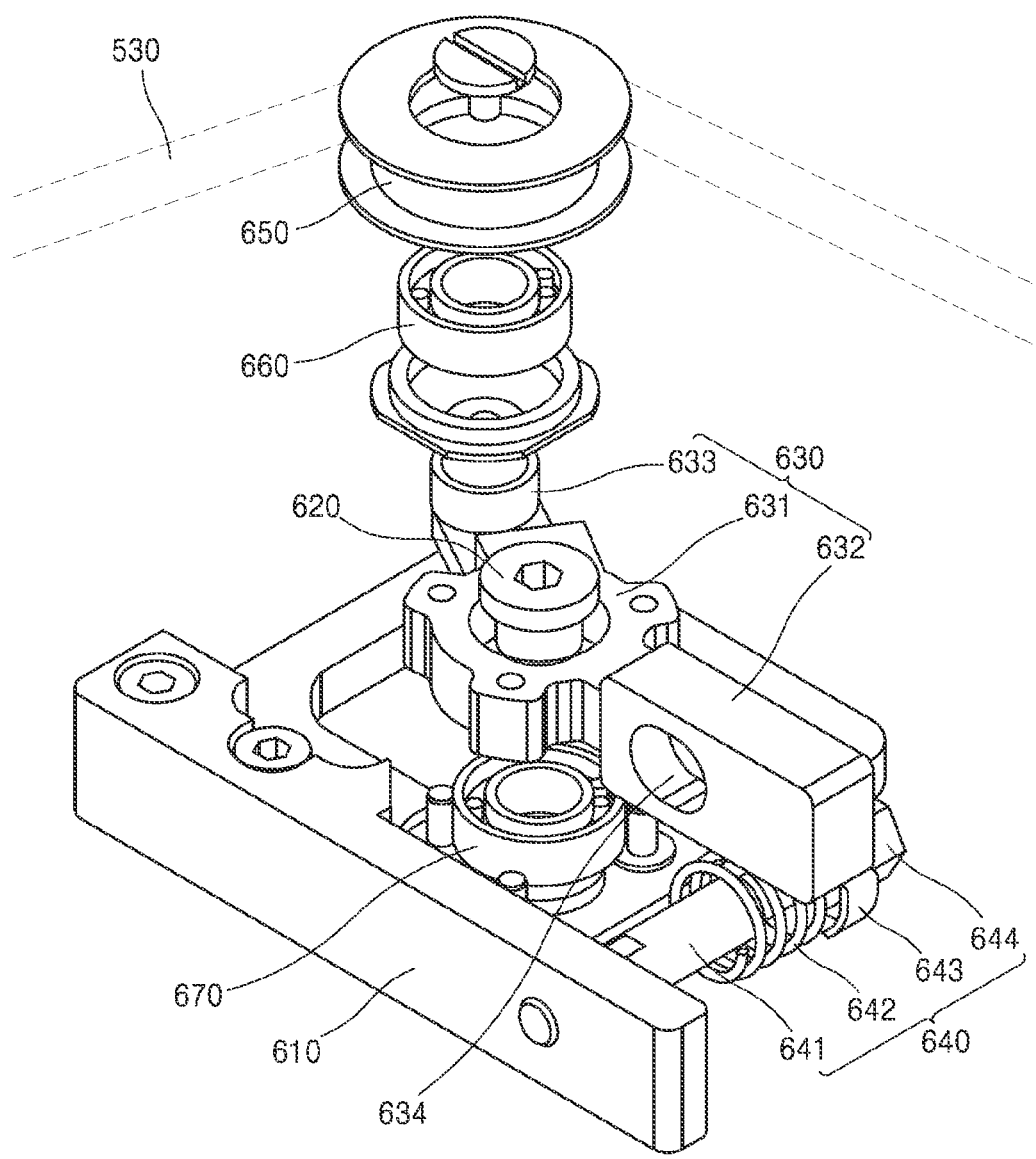
FIG. 4 is an exploded perspective view illustrating a tension adjuster according to one embodiment of the present disclosure.
Figure 5:
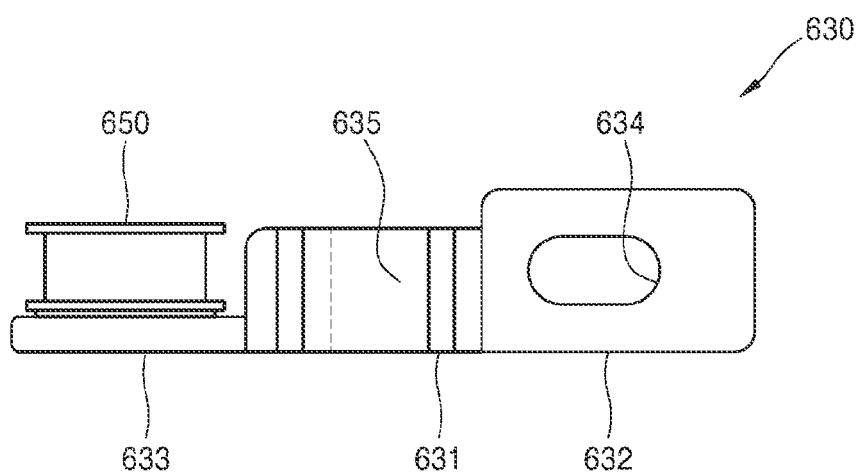
FIG. 5 is a side view illustrating the tension adjuster of FIG. 4.

FIG. 4 is an exploded perspective view illustrating the tension adjuster 600 according to one embodiment of the present disclosure. FIG. 5 is a side view illustrating the tension adjuster 600 of FIG. 4, and FIG. 6 is a top view illustrating the tension adjuster 600 of FIG. 4.

The tension adjuster 600 may include a body 610, a pivotal shaft 620, a pivoting part 630, an elastic part 640, and a first pulley 650.

Figure 6:
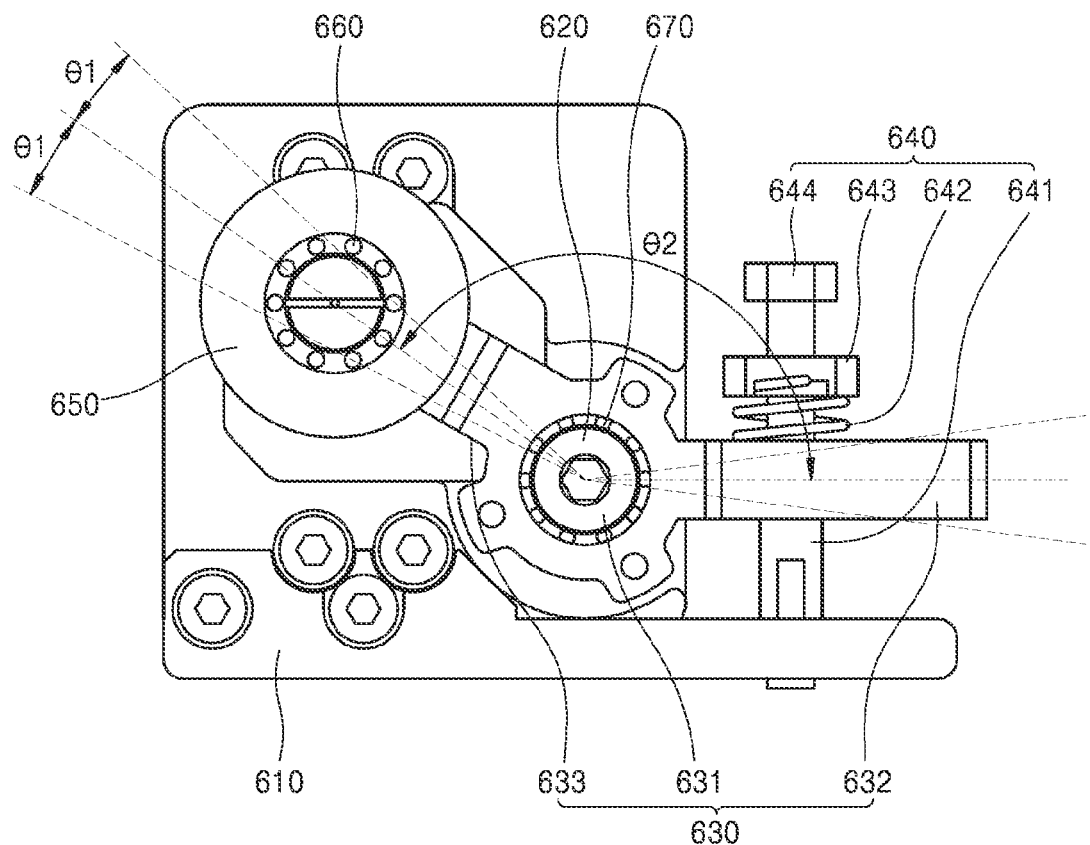
FIG. 6 is a top view illustrating the tension adjuster of FIG. 4.

As shown in FIGS. 4 to 6, the body 610 is a structure that is fixedly formed on the floor surface of the process chamber 100.

The pivotal shaft 620 may be coupled in the vertical direction of the body 610, and the elastic part 640 may be coupled in the horizontal direction.

The pivotal shaft 620 is a structure formed as a cylinder, and a second bearing 670 may be coupled to an outer side of the pivotal shaft 620, and the pivoting part 630 may be coupled to an outer side of the second bearing 670.

The pivoting part 630 may be coupled to the pivotal shaft 620, and may be extending in both directions so that one end and the other end are rotated around the pivotal shaft 620.

The pivoting part 630 may be coupled to the pivotal shaft 620 in the vertical direction, and may thus be rotated clockwise or counterclockwise about the pivotal shaft 620. Accordingly, one side and the other side of the pivoting part 630 may be rotated in the same direction. Here, the vertical direction is a direction parallel to the axial direction of the pivotal shaft 620.

Specifically, the pivoting part 630 may include a center portion 631, a first extension 632 extending to one side, a second extension 633 extending to the other side, and a through-hole 634.

The center portion 631 is a center around which the through-hole 634 is formed in a circular shape to allow the pivotal shaft 620 to be inserted thereinto.

The center portion 631 is coupled to the pivotal shaft 620 with a second bearing 670 interposed therebetween such that the pivoting part 630 can rotate about the pivotal shaft 620.

The first extension 632 may extend from the center portion 631 in one direction, and may be pressurized by the elastic part 640.

For example, the first extension 632 may be provided with the through-hole 634 into which at least a portion of the elastic portion 640 is inserted. For example, the through-hole 634 may be formed by penetrating at least a portion of one end of the pivoting part 630 such that a fixed portion 641 of the elastic part 640 may be inserted. In this case, the through-hole 634 may be elongated in a longitudinal direction of the pivoting part 630, as shown in FIG. 5, to allow the pivoting part 630 surrounding the fixed portion 641 to pivot when the pivoting part 630 is rotated about the pivotal shaft 620.

That is, the through-hole 634 of the pivoting part 630 may be circumferentially spaced apart from the pivotal shaft 620, which is the rotation axis of the pivoting part 630. In this case, when the pivoting part 630 is rotated about the pivotal shaft 620, the fixed portion 641 may be allowed to make a relative movement within the through-hole 634 because the through-hole 634 is larger than the fixed portion 641.

Furthermore, the rotation angle of the pivoting part 630 may be controlled by adjusting the size of the through-hole 634. Specifically, the longer the through-hole length of the through-hole 634 is, the larger the rotation angle of the pivoting part 630 may be. The shorter the through-hole length of the through-hole 634 is, the smaller the rotation angle of the pivoting part 630 may be. Preferably, the size of the fixed portion 641 and the size of the through-hole 634 may be set such that the rotation angle θ1 of the pivoting part 630 ranges up to 10 degrees in both directions.

The second extension 633 may extend from the center portion 631 to the other direction and an end thereof may be coupled to the first pulley 650. For example, the first bearing 660 may be coupled to the second extension 633 in a vertical direction as an axis, and the first pulley 650 may be coupled to the first bearing 660 such that the first pulley 650 can be rotated about the second extension 633.

In this case, the second extension 633 may be inclined at a predetermined angle with respect to any extended line of the first extension 632. For example, as shown in FIG. 6, the first extension 632 and the second extension 633 may be arranged to form a second angle θ2 therebetween. The second angle θ2 may be less than 180 degrees.

Also, when the first extension 632 and the second extension 633 extend in the same direction, the second angle θ2 may be less than 90 degrees.

As the second extension 633 is inclined at a predetermined angle with respect to the first extension 632, the tension applied to the power transmitter 530 may be adjusted.

As shown in FIGS. 4 to 6, the elastic part 640 may be arranged to press against an end of the pivoting part 630.

The elastic part 640 may include a fixed portion 641, an elastic member 642, an elasticity adjuster 643, and an anti-separation portion 644.

The fixed portion 641 may be coupled and fixed to a portion of the body 610 and may be inserted into the through-hole 634 formed in the first extension 632 of the pivoting part 630.

The elasticity adjuster 643 may be arranged on a portion of the fixed part 641 and have a larger cross-section than the fixed portion 641 so as to be coupled to the fixed portion 641.

The elasticity adjuster 643 may be arranged to be movable and fixable on the fixed portion 641 such that the distance between the elasticity adjuster 643 and the pivoting part 630 can be adjusted. For example, the elasticity adjuster 643 may be screw coupled to the fixed portion 641 such that it can be fixed at any position on the fixed portion 641.

The elastic member 642 may be coupled between the pivoting part 630 and the elasticity adjuster 643, and may be arranged to push the pivoting part 630 away from the elasticity adjuster 643.

Specifically, the elastic member 642 may apply pressure to the pivoting part 630 in a direction that pushes the first extension 632 of the pivoting part 630 away from the elasticity adjuster 643. Accordingly, the first extension 632 may be rotated clockwise (or counterclockwise) around the pivotal shaft 620, and the second extension 633 may be rotated in the same direction along the first extension 632.

Accordingly, the first pulley 650 coupled to the second extension 633 may create additional tension on the power transmitter 530 to the opposite side.

The elastic member 642 may be formed as any one of a coil spring, an elastic block, a pair of magnets, and combinations thereof that exerts a force to push the first extension 632 away from the elasticity adjuster 643.

The anti-separation portion 644 may be provided as a flange at an end of the fixed portion 641 to prevent the elasticity adjuster 643 from being separated from the fixed portion 641.

As shown in FIGS. 4 to 6, the first pulley 650 may be arranged to be at least partially surrounded by the power transmitter 530 and may be rotatably coupled to the opposite end of the pivoting part 630.

Specifically, the first pulley 650 may be coupled to an outer side of the first bearing 660 coupled to the second extension 633, and may be arranged to be at least partially surrounded by the power transmitter 530, such that the power transmitter 530 is driven by rotation of the first pulley 650.

The substrate processing apparatus according to the present disclosure may prevent the tension of the power transmitter 530, which connects a plurality of rotating plates 520 to drive the rotating plates 520 simultaneously, from being changed when the temperature inside the process chamber 100 changes. Further, it may also automatically adjust the tension of the connection structure even when the position of the heater is changed.

As is apparent from the above description, the present disclosure provides the following effects.

According to some embodiments of the present disclosure, tension of a connection structure, such as a belt connecting a plurality of rotary modules, may be prevented from changing according to a change in temperature inside the chamber. Also, the tension of the connection structure may be automatically adjusted when thermal expansion of the connection structure occurs or when the position of the heater is changed.

Furthermore, with the substrate processing apparatus, the cylinder part for maintaining the tension may be prevented from being jammed and fixed in a structure, which causes the tension to become uncontrollable. It should be noted that the scope of the present disclosure is not limited by this effect.

Although the present disclosure has been described with reference to the embodiments shown in the drawings, these are exemplary only, and those of ordinary skill in the art will appreciate that various modifications and other equivalent embodiments are possible. Therefore, the true scope of the present disclosure should be defined by the appended claims of the present disclosure.

What is claimed is:

1. A substrate processing apparatus comprising:
   a process chamber having a processing space defined therein to process a plurality of substrates;
   a gas injector provided on a upper side of the process chamber to inject a processing gas into the processing space;
   a plurality of substrate supports arranged inside the process chamber to face the gas injector, the plurality of substrates being seated on the plurality of substrate supports;
   a substrate conveyor disposed in the process chamber to convey the plurality of substrates seated on the substrate supports to different substrate supports among the substrate supports; and
   a substrate rotating part arranged to allow each of the plurality of substrates to be seated between neighboring substrate supports among the plurality of substrate supports, and to rotate the plurality of seated substrates,
   wherein the substrate rotating part comprises:
   a drive shaft disposed at a lower portion of the process chamber to be rotationally driven about a center axis;
   a rotating plate connected to the drive shaft to rotate with rotation of the drive shaft, the rotating plate comprising a plurality of rotating seats allowing the plurality of substrates to be seated thereon;
   a power transmitter connecting the drive shaft and the rotating plate to allow a rotational force of the drive shaft to be transmitted to the rotating plate; and
   a tension adjuster disposed on at least a portion of the power transmitter to adjust a tension in the power transmitter connecting the drive shaft and the rotating plate.

2. The apparatus of claim 1, wherein the tension adjuster comprises:
   a pivotal shaft formed in a cylindrical shape;
   a pivoting part coupled to the pivotal shaft and extending in both directions so that one end and the other end are rotated around the pivotal shaft;
   an elastic part arranged to press against the one end of the pivoting part; and a first pulley disposed to be at least partially surrounded by the power transmitter, the first pulley being rotatably coupled to the other end of the pivoting part.

3. The apparatus of claim 2, wherein the pivoting part comprises:
   a center portion penetrated in a circular shape to allow the pivotal shaft to be inserted thereinto;
   a first extension extending from the center portion to one side direction, and pressed by the elastic part; and
   a second extension extending from the center portion to the other side direction, a second extension having one end coupled to the first pulley.

4. The apparatus of claim 3, wherein the second extension is inclined at a predetermined angle with respect to any extended line of the first extension.

5. The apparatus of claim 2, wherein the pivoting part comprises:
   a through-hole formed by penetrating at least one portion of the one end of the pivoting part to allow a fixed portion of the elastic part to be inserted thereinto;
   wherein the through-hole is elongated in a longitudinal direction of the pivoting part to allow the pivoting part surrounding the fixed portion to be rotated when the pivotal shaft is rotated about the pivotal part.

6. The apparatus of claim 2, wherein the elastic part comprises:
   a fixed portion disposed to be inserted into at least a portion of the pivoting part;
   an elasticity adjuster coupled to a portion of the fixed portion and having a cross-section larger than the fixed portion; and
   an elastic member disposed between the pivoting part and the elasticity adjuster to push the pivoting part away from the elasticity adjuster.

7. The apparatus of claim 6, wherein the elasticity adjuster is screw-coupled to the fixed portion so as to be fixed at any position on the fixed portion.

8. The apparatus of claim 6, wherein the elastic part comprises:
   an anti-separation portion coupled to a distal end of the fixed portion to prevent the elasticity adjuster from being separated from the fixed portion.

9. The apparatus of claim 6, wherein the elastic member is any one of a coil spring, an elastic block, a pair of magnetic materials, or a combination thereof.

10. The apparatus of claim 1, wherein the power transmitter is a belt formed in a closed shape,
    the apparatus comprising:
    a plurality of second pulleys disposed under the rotating plate and coupled to an inner side of the power transmitter,
    wherein the drive shaft is coupled to an outer side of the power transmitter,
    wherein the tension adjuster is coupled to the inner side of the power transmitter to push the power transmitter outward to create a tension in the power transmitter.

* * * * *